(12) United States Patent
Yoneyama et al.

(10) Patent No.: US 6,349,061 B1
(45) Date of Patent: Feb. 19, 2002

(54) NON-VOLATILE SEMICONDUCTOR MEMORY

(75) Inventors: Akira Yoneyama; Yoshinobu Kaneda, both of Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/375,697

(22) Filed: Aug. 17, 1999

(30) Foreign Application Priority Data

Aug. 27, 1998 (JP) ............................................ 10-242297
Aug. 27, 1998 (JP) ............................................ 10-242299

(51) Int. Cl.$^7$ ............................................. G11C 16/04
(52) U.S. Cl. ............................ 365/185.29; 385/185.21; 385/185.23; 385/185.09
(58) Field of Search ...................... 365/185.11, 185.21, 365/185.29, 185.09, 185.23

(56) References Cited

U.S. PATENT DOCUMENTS

| | | | | |
|---|---|---|---|---|
| 5,329,488 A | * | 7/1994 | Hashimoto | 365/200 |
| 5,347,490 A | * | 9/1994 | Terade et al. | 365/219 |
| 5,442,586 A | * | 8/1995 | Javanifard et al. | 365/185 |
| 5,550,772 A | * | 8/1996 | Gill | 365/185.03 |
| 5,608,676 A | * | 3/1997 | Medlock et al. | 365/189.09 |
| 5,663,907 A | | 9/1997 | Frayer et al. | 365/185.18 |
| 5,732,021 A | | 3/1998 | Smayling et al. | 365/185.29 |
| 5,784,319 A | * | 7/1998 | Villa et al. | 365/185.33 |
| 5,801,993 A | * | 9/1998 | Choi | 365/185.28 |
| 5,831,905 A | * | 11/1998 | Hirano | 365/185.29 |
| 5,905,676 A | * | 5/1999 | Ohwa | 365/185.21 |
| 6,069,821 A | * | 5/2000 | Jun et al. | 365/185.21 |
| 6,134,147 A | * | 10/2000 | Kaneda | 365/185.25 |

FOREIGN PATENT DOCUMENTS

EP          EP0757356 A1       7/1995 ........... G11C/16/06

* cited by examiner

*Primary Examiner*—David Nelms
*Assistant Examiner*—Gene N. Auduong
(74) *Attorney, Agent, or Firm*—Fish & Richardson P.C.

(57) ABSTRACT

To assure collective erasure irrespectively of whether or not there is any faulty sector which is an object for redundancy. A non-volatile semiconductor memory having a plurality of regions of sectors for which collective erasure of stored data can be made, comprising: a high voltage generating circuit 8 for generating a high voltage used for erasing data for the non-volatile semiconductor memory; a plurality of transistors 10A, 10B and 10C each connected between the high voltage generating circuit and the plurality of regions of sectors 9A, 9B and 9C; wherein constant current operation for the plurality of transistors 10A, 10B and 10C is performed for collective erasure of the data so as to limit the current flowing through the plurality of regions of sectors.

18 Claims, 3 Drawing Sheets

NON-VOLATILE SEMICONDUCTOR MEMORY

BACKGROUND OF THE INVENTION

1. Field of the Invention

The present invention relates to a non-volatile semiconductor memory, and more particularly to a non-volatile semiconductor memory, such as an EPROM (Erasable and Programmable ROM), or EEPROM (referred to as Electrical Erasable and Programmable ROM, flash EEPROM, or flash memory), in which data are stored (written/read) by accumulating charges in a floating gate and detecting a change in a threshold voltage in terms of the presence or absence of the charges by a control gate.

2. Description of the Related Art

A technique of using a redundant memory cell built in a semiconductor memory in place of a memory cell which cannot be used because of its defect has been developed. The address of a defective memory cell can be known in the process of manufacturing the semiconductor memory. The address of the defective memory cell is stored previously in a redundant address. It is always observed whether or not the address generated from a normal address generating circuit is that of the defective cell. If so, the redundant memory cell is addressed in place of the defective memory cell. Namely, the address line having the defective memory cell is not used.

FIG. 3 is a circuit showing a part of an addressing circuit 1 of the semiconductor memory having such a redundancy function.

An address data for addressing is applied to the address generating circuit 1. An address data of a defective memory cell, which can be known from a test during the manufacturing process of the semiconductor memory cell, is applied to a redundant address generating circuit 2. A comparator 3 compares an output signal from the address generating circuit and that from the redundant address generating circuit 1. In this case, it generates a "H" level signal when the address data of the defective memory cell is generated from the address generating circuit 1, and an "L" level signal in other cases. A first switching means determines whether or not the output signal from the address generating circuit 1 should be selected according to the output from the comparator 3. Each of decoders decodes the address data from the first switching means 4. The decoding intends to designate the normal memory cell, or to designate the defective memory cell, i.e. to decode the address for redundancy. These decoders 5A, 5B, 5C and 5D are connected to word lines WL0, WL1, WL2 and WL3, respectively. Although not shown, a larger number of decoders and WL's are actually connected.

When the normal address, but not redundant address is generated, the output signal from the address generating circuit 1 is applied to the decoders 5A, 5B, 5C and 5D through the first switching means 4. The output from the decoder corresponding to the selected WL becomes "L" level. Thus, the memory cell is designated.

When the redundant address is generated from the address generating circuit 1, the "H" level is generated from the comparator 3 so that the "L" level is applied to each of the AND gates constituting the first switching means 4. Thus, the address from the address generating circuit 1 is not applied to the decoders 5A, 5B, 5C and 5D.

On the other hand, the "H" level from the comparator 3 is applied to an AND gate 6 so as to be conductive. The addressing signal from the redundant address generating circuit 2 is sent to a redundant word line RWL through the AND gate 6 so that the redundant memory cell can be addressed.

Accordingly, in the device as shown in FIG. 3, the redundant address can be designated.

However, where the above semiconductor memory is a non-volatile semiconductor memory called a flash memory, as the case may be, the following problem happened.

Now, referring to FIG. 4, an explanation will be given of such a non-volatile semiconductor memory. Although the non-volatile semiconductor memory cell is roughly classified into a split-gate type and a stacked-gate type, the split-gate type non-volatile semiconductor memory as disclosed in WO92/18980 (G11C13/00) will be explained.

FIG. 4 is a circuit diagram of a memory cell array 21 in which non-volatile memories 20A, 20B, 20C and 20D are arranged in a matrix form. FIG. 5 is a view showing the structure of a certain memory cell therein.

As seen from FIG. 4, in adjacent non-volatile semiconductor memories 20A and 20B, and 20C and 20D, their source regions are commonly connected to a source line SL, and their drain regions are connected to bit lines BL0, and BL1, respectively. The control gates CG's of the non-volatile memories 20A and 20C, and 20B and 20D are connected to word lines WL0 and WL1, respectively. In such a spirit gate structured non-volatile semiconductor memory, as shown in FIG. 5, since the control gate electrode CG is formed from on the upper surface of the floating gate electrode to on the side surface thereof, a distance between the control gate electrode CG and the bit lines becomes narrower. Therefore according to the progress of miniaturization of the device, the interval between the bit lines BL0, BL1 and control gates CG's (word lines) becomes very narrow so that short-circuiting is likely to occur in comparison with the stacked gate structure in which control gate electrode is formed on the floating gate electrode. When the short-circuiting occurs, the memory at issue cannot be used and dealt with as a defective cell An explanation will be given of the method of writing, reading or erasing data (charge) into or from the non-volatile semiconductor memory having such a structure. The following explanation will be particularly directed to the non-volatile semiconductor memory cell 20A.

The writing operation is made as follows. The voltages of e.g. 0 V, 11V and 2V are applied to the bit line BL0, source line SL and word line WL0, respectively. In this case, since a high voltage is applied to the source line, the potential of a floating gate FG which is strongly capacitive-coupled with a diffused layer (not shown) constituting the source line is raised to about 9 V. As a result, hot electrons generated between the drain region and source region jump into the floating gate FG, thus making the data writing operation.

The reading operation is made as follows. The voltages of e.g. 2 V, 0 V and 4 V are applied to the bit line BL0, source line SL and word line WL0, respectively. In this case, it is determined whether or not data. has been stored in the floating gate FG according to whether or not a reading operation current flows from the drain region to the source region. Specifically, when the reading operation current does not flow, the data has been stored in the floating gate. The erasure is made as follows. The voltages of e.g. 0 V, 0 V and 14 V are applied to the bit line BL0, source line SL and word line WL0, respectively. Then, the charge stored in the floating gate is pulled out toward the control gate CG so that the data is erased.

In the non-volatile semiconductor memory having the above structure, when all the word lines WL's must be simultaneously selected for data erasure, if there is any leaking defective cell, the high voltage (14 V in the above explanation) required for erasure cannot be supplied to each control gate CG.

In FIG. 3, all the decoders 5A, 5B, 5C and 5D are selected for data erasure. The high voltage from the high voltage generating circuit 8 is applied to the word lines WL0, WL1, WL2 and WL3 through the decoders 5A, 5B, 5C and 5D, respectively. If there is leakage failure in any memory cell (cell directed to redundancy) connected to the word lines WL0, WL1, WL2 and WL3, the voltage on these word lines cannot be raised to about 14 V. Therefore, erasure cannot be normally made for all the memory cells connected to WL0, WL1, WL2 and WL3.

Now, the leakage failure refers to short-circuiting in the word line WL's that is a phenomenon that excessive current flows through the word line WL. This is attributable to that poor connecting occurs between the word line WL and bit line BL.

Meanwhile, in some non-volatile semiconductor memories, the storage area is divided into a plurality of regions called sectors. One sector is a minimum unit for which collective erasure can be made. Using the sector facilitates local erasure.

On the other hand, there is a case where it is desired to make the erasure for the entire chip. To this end, the erasure can be made successively for each of the sectors. This lengthens the total time taken for erasure. Therefore, collective erasure is desired for plural sectors.

However, the entire chip may include the sector having the cell suffering from the above leakage failure (although the poor sector is replaced by the redundant sector, it is included for the object for erasure when collective erasure is made for the entire chip). If the chip includes such a sector, as described above, the high voltage required for erasure cannot be supplied to each control gate. Namely, the faulty sector which is an object for redundancy will affect the normal sector.

As a result, there was a serious circumstance which impedes the collective erasure in an essential meaning.

SUMMARY OF THE INVENTION

The present invention intends to provide a non-volatile semiconductor memory for which collective erasure can be made irrespectively of whether or not there is any faulty sector which is an object of redundancy.

A first aspect of the memory is a non-volatile semiconductor memory having a plurality of regions of sectors collectively erasable of stored data of the present invention, which comprises: a high voltage generating circuit for generating a high voltage used for erasing data for the non-volatile semiconductor memory; and a plurality of constant current circuits each connected between said high voltage generating circuit and said plurality of sector regions; wherein said plurality of constant current circuits are operated in collective erasure of the data so as to limit the current flowing through said plurality of regions of sectors.

A second aspect of the present invention is a non-volatile semiconductor memory according to the first aspect, wherein each of said plurality of constant current circuits is a current mirror circuit, and constant current transistors each of which produces an output current corresponding to an input current to said current mirror circuit are connected to said plurality of regions of sectors.

A third aspect of the present invention is a non-volatile semiconductor memory according to the first aspect, which further comprises a switch for releasing the constant current operation by said plurality of transistors during non-erasure operation of the data.

A fourth aspect of the present invention is a non-volatile semiconductor memory according to the first aspect, wherein said non-volatile semiconductor memory is a split-gate type of EEPROM, and each of said current mirror circuits is connected each of word lines of said EEPROM.

The present invention has been accomplished in order to solve the problem described above. As shown in FIG. 1, in accordance with the present invention there is provided a non-volatile semiconductor memory 20A, 20B, 20C, 20D (FIG. 4) having a plurality of regions of sectors 9A, 9B and 9C for which collective erasure of stored data can be made, comprising: a high voltage generating circuit 8 for generating a high voltage used for erasing data for the non-volatile semiconductor memory; a plurality of transistors 10A, 10B and 10C each connected between the high voltage generating circuit and the plurality of regions of sectors 9A, 9B and 9C; wherein constant current operation for the plurality of transistors 10A, 10B and 10C is performed in collective erasure of the data so as to limit the current flowing through the plurality of regions of sectors.

The present invention is characterized in that the non-volatile semiconductor memory 20A, 20B, 20C, 20D comprises a switch 19 for releasing the constant current operation by the plurality of transistors in non-erasure of the data as shown in FIG. 2.

In accordance with the present invention, in the collective erasure in the non-volatile semiconductor memory, since the high voltage required for erasure can be maintained even if there is any faulty sector among sectors, collective erasure can be made for all the sectors.

In accordance with the present invention, since the above effect can be obtained in such a manner that the transistor connected between the high voltage generating circuit and each sector is only operated in the saturated region. This does not lead an increase in the number of elements due to a complicated circuit structure.

Further, in accordance with the present invention, since the transistor connected between the high voltage generating circuit and each sector is caused to make the complete "ON" operation during the non-erasure operation, during the other operation than the erasure operation, a sufficient current can be caused to flow, thereby suppressing reduction in a response speed.

DESCRIPTION OF THE PREFERRED EMBODIMENTS

Figure 1:
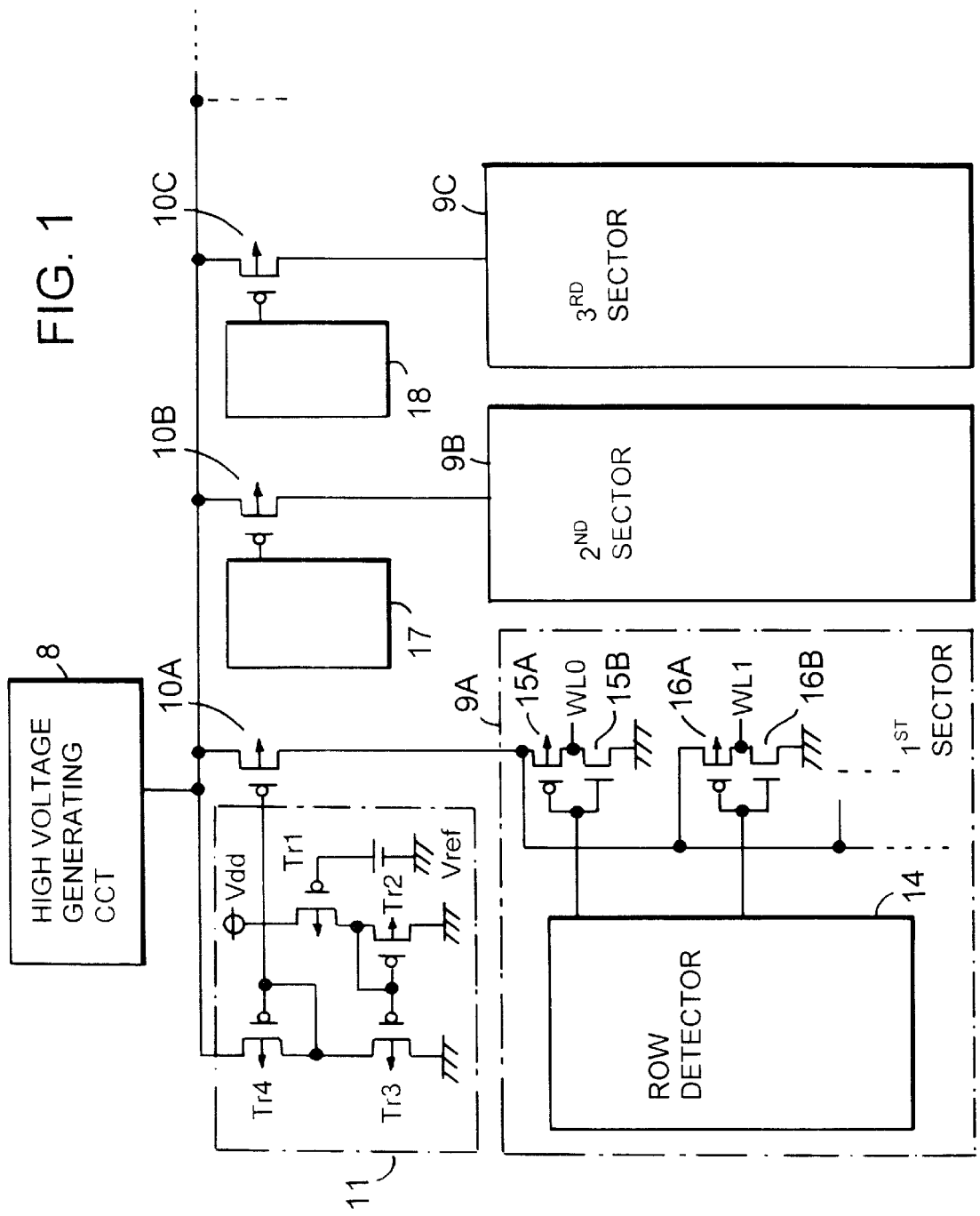
FIG. 1 is a circuit diagram of a non-volatile semiconductor memory according to the first embodiment of the present invention.

Referring to FIG. 1, an explanation will be given of the first embodiment of the present invention.

In FIG. 1, reference numeral 8 denotes a high voltage erasure generating circuit for generating an erasure voltage (14 V in this embodiment) to be supplied to a word line WL of the non-volatile semiconductor memory. Incidentally, although not illustrated, a writing voltage generating circuit and a reading operation voltage generating circuit are also arranged for supplying a writing and reading operation voltage to the word line. Any voltage generating circuit is selectively connected by an operation of a switch (not shown) according to each of the writing operation, reading operation or erasure of data so that a desired voltage is supplied to the word line WL from the selected desired voltage generating circuit.

The feature of the non-volatile semiconductor memory resides in that a first, a second and a third transistor 10A, 10B and 10C each of which is a constant current transistor are connected between a first, a second and a third sector 9A, 9B and 9C each of which is a minimum unit allowing collective erasure of stored data and the high voltage generating circuit so as to supply a constant current to the first to third sectors.

Each of constant current generating circuits, e.g. current mirror circuits 11, 17 and 18 controls the current flowing through each of the transistors 10A, 10B and 10C to be a constant current. Each transistors 10A, 10B, 10C constitutes a portion of the corresponding current mirror circuit.

The structure of the current mirror circuit 11, 17, 18, which is well known, will be explained simply. When a reference voltage is supplied to the gate electrode of a first P-channel MOS transistor Tr1 with a source electrode connected to a power supply voltage Vdd, a constant current based on the reference voltage Vref flows through the first P-channel MOS transistor Tr1. This constant current determines a current to be supplied to a second P-channel MOS transistor Tr2 with a drain region connected to ground. This determines a current to be supplied to a third P-channel MOS transistor with a gate electrode connected commonly to the gate electrode of the second P-channel MOS transistor Tr2. Further, this determines a current to be supplied to a fourth P-channel MOS transistor Tr4 connected in series to the third P-channel MOS transistor Tr3. Accordingly, this determines a current to be supplied to the transistor 10A with a gate electrode connected commonly to the gate electrode of the fourth P-channel MOS transistor Tr4. Thus, the constant current based on the reference voltage Vref is supplied to the transistor 10A.

Likewise, in the current mirror circuit 17, 18, the constant current is supplied to the transistor 10B, 10C, respectively.

Figure 4:
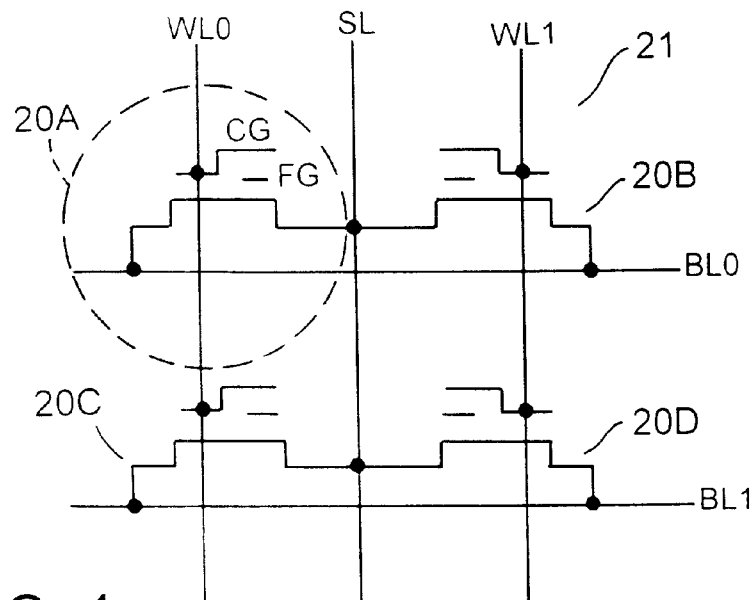
FIG. 4 is a circuit diagram of a conventional semiconductor memory.
Figure 5:
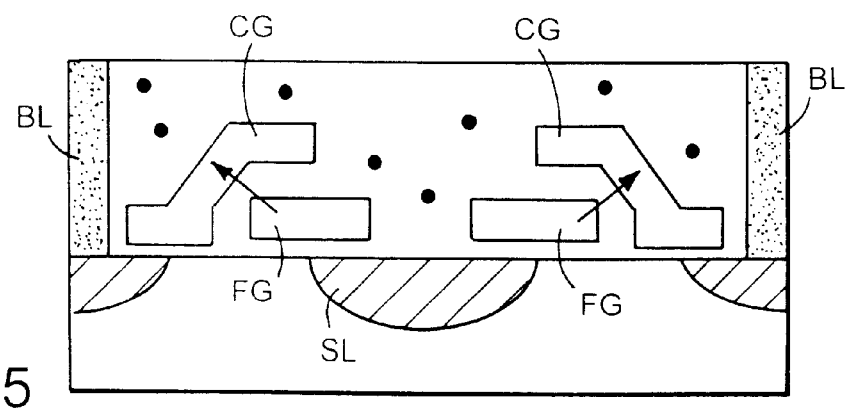
FIG. 5 is a sectional view of a split-gate type semiconductor memory.
Figure 3:
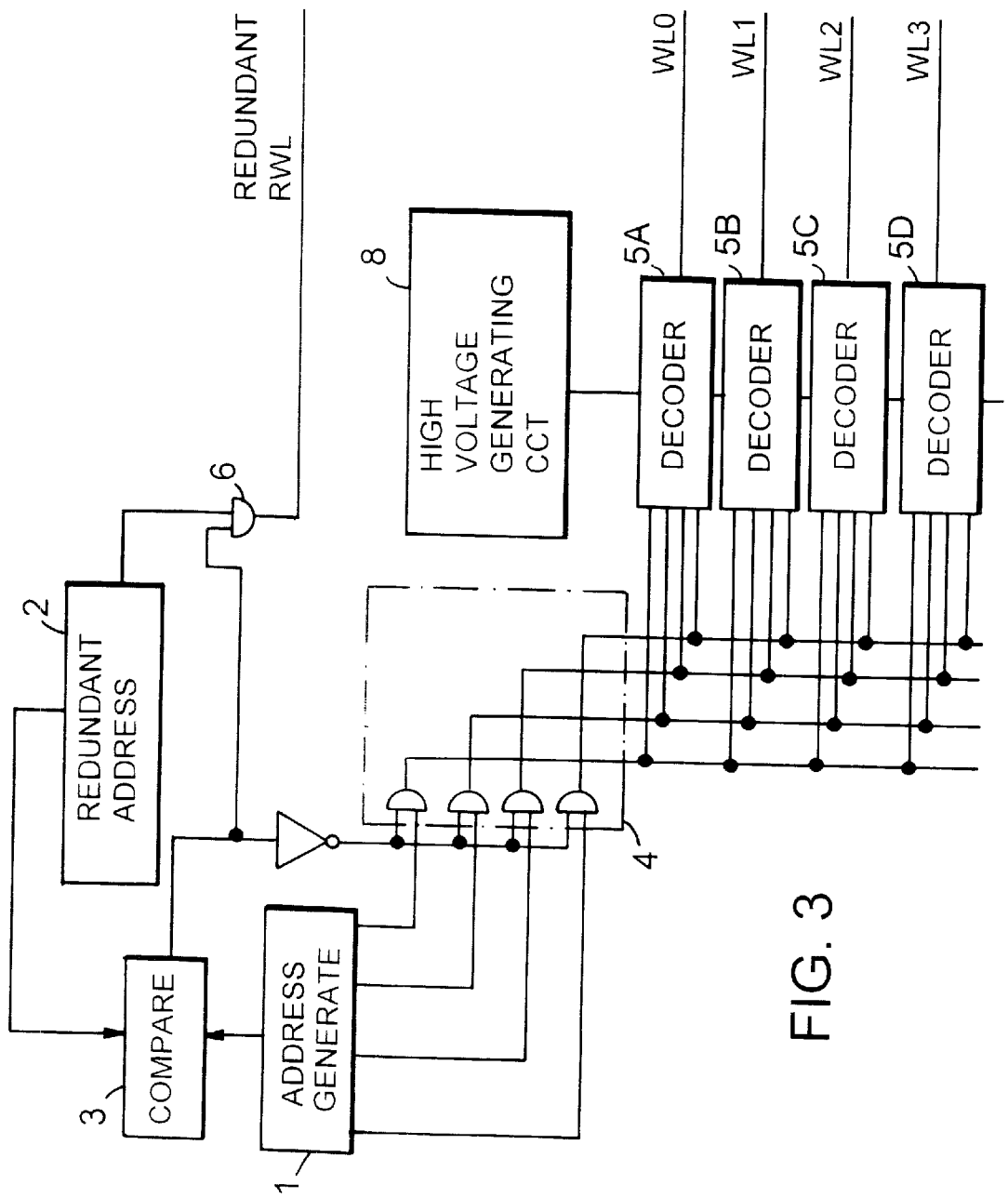
FIG. 3 is a circuit diagram of a conventional non-volatile semiconductor memory.

In FIG. 1, although only the first, the second and third sector are illustrated, a larger number of sectors are actually arranged. Further, in the first sector, only the word lines WL0 and WL1 are illustrated, more word lines WL's are actually arranged. Although word lines WL's are actually connected to the non-volatile semiconductor memories 20A, 20B, 20C, 20D, etc. as seen from FIG. 4, they are not illustrated in FIG. 1 for simplicity of illustration.

It should be noted that each of the second sector 9B and third sector 9C has the same internal structure as that of the first sector 9A.

In FIG. 1, for the purpose of collective erasure, the high voltage (about 14 V) from the high voltage generating circuit 8 must be applied to the word line WL0 and WL1. This high voltage is commonly used to all the sectors. Specifically, the high voltage is applied to the first sector 9A through the first transistor 10A, to the second sector 9B through the second transistor 10B and to the third sector 9C through the third transistor 10C, respectively.

At the time of the collective erasing operation, an "L" level of voltage is applied to the gates of a P-channel MOS transistor and an N-channel MOS transistor with:their gates commonly connected. Therefore, the transistors 15A and 16A turn on whereas the transistors the transistors 15B and 16B turn off. Thus, the constant current supplied to the first transistor 10A is applied to the word lines WL0 and WL1.

In this case, in accordance with the present invention, the first transistor 10A is operated in its saturated region. Therefore, the current flowing therethrough is constant. Thus, this current is limited to a constant even if any faulty word line WL is included in the first sector 9A. Accordingly, the potential of the high voltage supplied from the high voltage generating circuit 8 will not be lowered.

Such an action which is a feature of the present invention is common to the first to third sectors 9A, 9B and 9C.

In order that the first transistor 10A operates in the saturated region, in FIG. 1, the first transistor 10A is used as a part of the current mirror circuit 11. The current to be supplied to the first transistor 10A is created by the transistor Tr1 with the gate supplied with the reference voltage Vref. Therefore, the current supplied to the first transistor 10A can be controlled optionally in accordance with the level of the reference voltage Vref. The transistors 10B and 10C are controlled so as to operate in their saturated region by the current mirror circuits, respectively.

Thus, in the non-volatile semiconductor memory according to the present invention as shown in FIG. 1, unlike the prior art, drop of the high voltage required for erasing due to the leak current does not occur even if there is any faulty sector. This assures collective erasing of the data for all the sectors.

Meanwhile, the presence of the transistors 10A to 10C is disadvantageous from the viewpoint of the normal access operation for each of the sectors 9A to 9C. This is because the timing of a control signal for the memory cell is retarded.

Figure 2:
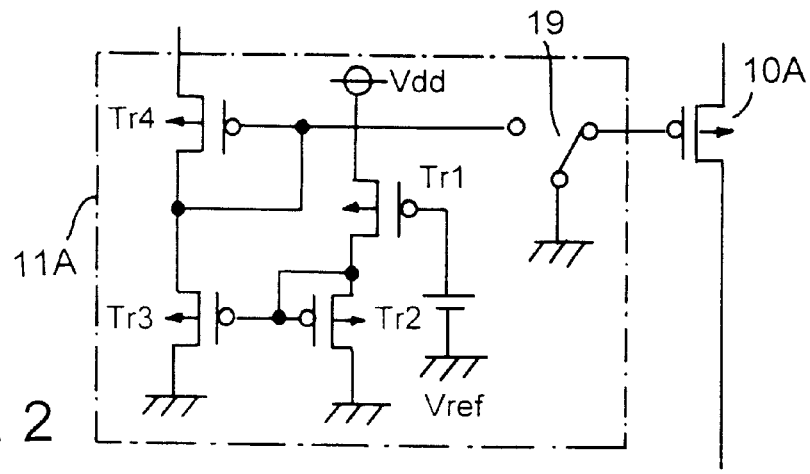
FIG. 2 is a circuit diagram of a non-volatile semiconductor memory according to the second embodiment of the present invention.

A second embodiment intends to avoid such a new problem. Referring to FIG. 2, an explanation will be given of the second embodiment. FIG. 2 shows only the current mirror circuit 11A which exhibits the feature of the second embodiment. The remaining structure of the second embodiment is the same as that shown in FIG. 1.

This embodiment intends to reduce the degree of the adverse affect (retardation of an access operation) from the presence of the transistors 10A to 10C in such a manner that in the operation other than the collective or individual erasing operation for the sectors, i.e. in the writing operation and reading operation, the transistors 10A to 10C are switched into their complete conducting state to operate in their triode region.

To this end, in this embodiment, as seen from FIG. 2, a switch 19 is provided between the gate electrode of the transistor 10A and ground so that on the basis of an internal status signal (signal for verifying various kinds of operations for the non-volatile semiconductor memory), during the erasing operation, the switch 19 is closed toward the side of the fourth P-channel MOS transistor Tr4 to operate the transistor 10A in the saturated region whereas during the non-erasing operation, the switch 19 is closed toward the ground. In this way, during the operation other than erasing operation, the transistor 10A is switched into the complete conducting state so as to operate in the triode region (i.e. the operation of supplying the constant current by the current mirror circuit 11 is stopped). The current mirror circuits 17 and 18 can be constructed in the same manner so that the current supplied to the transistors 10B and 10C is adjusted.

In the non-volatile semiconductor memory having a redundancy function, the present invention assures collective erasing irrespectively of whether or not there is any faulty sector which is an object of redundancy. The present invention can be applied to not only the split-gate type non-volatile memory explained in connection with the embodiments described above, but also a stack-gate type non-volatile memory and a memory cell with an erasing gate for an exclusive use. Further, Although the constant current circuit is disposed on the word line in order to prevent the short-circuiting between the word line WL and the bit line BL, which have an only small margin, the constant current circuit (current mirror circuit) can be arranged at not only the word line, but also the place where short-circuiting is apt to occur according to a cell structure.

What is claimed is:

1. A non-volatile semiconductor memory having a plurality of regions of sectors collectively erasable of stored data, comprising:

a high voltage generating circuit for generating a high voltage used for erasing data for the non-volatile semiconductor memory;

a plurality of constant current circuits each connected between said high voltage generating circuit and said plurality of sector regions, a constant current circuit being connected to each of word lines in a sector;

wherein said sector regions are of the same size and said plurality of constant current circuits are operated to limit the current flowing through said plurality of regions of sectors for collectively erasing the data.

2. A non-volatile semiconductor memory according to claim 1, wherein each of said plurality of constant current circuits is a current mirror circuit, and constant current transistors each of which produces an output current corresponding to an input current to said current mirror circuit are connected to said plurality of regions of sectors.

3. A non-volatile semiconductor memory according to claim 1, further comprising a switch for releasing the constant current operation by said plurality of transistors during non-erasure operation of the data.

4. A non-volatile semiconductor memory according to claim 1, wherein said non-volatile semiconductor memory is a split-gate type of EEPROM.

5. A non-volatile semiconductor memory according to claim 1, wherein said sector regions include a sector having a cell suffering from a leakage failure.

6. A non-volatile semiconductor memory having a plurality of regions of sectors collectively erasable of stored data, comprising:

a high voltage generating circuit for generating a high voltage used for erasing data for the non-volatile semiconductor memory;

a plurality of constant current circuits each connected between said high voltage generating circuit and said plurality of sector regions, a constant current circuit being connected to each of word lines in a sector;

wherein each of said plurality of regions of sectors is a minimum unit allowing collective erasure of the stored data, and said plurality of constant current circuits are operated to limit the current flowing through said plurality of regions of sectors for collectively erasing the data.

7. A non-volatile semiconductor memory according to claim 6, wherein each of said plurality of constant current circuits is a current mirror circuit, and constant current transistors each of which produces an output current corresponding to an input current to said current mirror circuit are connected to said plurality of regions of sectors.

8. A non-volatile semiconductor memory according to claim 6, further comprising a switch for releasing the constant current operation by said plurality of transistors during non-erasure operation of the data.

9. A non-volatile semiconductor memory according to claim 6, wherein said non-volatile semiconductor memory is a split-gate type of EEPROM.

10. A non-volatile semiconductor memory having a plurality of regions of sectors collectively erasable of stored data, comprising:

a high voltage generating circuit for generating a high voltage used for erasing data for the non-volatile semiconductor memory;

a plurality of constant current circuits each connected between said high voltage generating circuit and said plurality of sector regions, a constant current circuit being connected to each of word lines in a sector;

wherein said sectors include a sector having a memory cell suffering from a leakage failure, and said plurality of constant current circuits are operated to limit the current flowing through said plurality of regions of sectors for collectively erasing the data.

11. A non-volatile semiconductor memory according to claim 10, wherein each of said plurality of constant current circuits is a current mirror circuit, and constant current transistors each of which produces an output current corresponding to an input current to said current mirror circuit are connected to said plurality of regions of sectors.

12. A non-volatile semiconductor memory according to claim 10, further comprising a switch for releasing the constant current operation by said plurality of transistors during non-erasure operation of the data.

13. A non-volatile semiconductor memory according to claim 10, wherein said non-volatile semiconductor memory is a split-gate type of EEPROM.

14. A non-volatile semiconductor memory having a plurality of regions of sectors collectively erasable of stored data, comprising:

a high voltage generating circuit for generating a high voltage used for erasing data for the non-volatile semiconductor memory;

a plurality of constant current circuits each connected between said high voltage generating circuit and said plurality of sector regions;

wherein said non-volatile semiconductor memory is a split-gate type of EEPROM, each of said constant current circuits is connected to each of word lines in a sector of said EEPROM, and said plurality of constant circuits are operated to limit the current flowing through said plurality of regions of sectors for collectively erasing the data.

15. A non-volatile semiconductor memory having a plurality of regions of sectors collectively erasable of stored data, comprising:

a high voltage generating circuit for generating a high voltage used for erasing data for the non-volatile semiconductor memory;

a plurality of constant current circuits each connected between said high voltage generating circuit and said plurality of regions of sectors, a constant current circuit being connected to each of word lines in a sector;

wherein said plurality of constant current circuits are arranged to provide a constant current to flow through said plurality of regions of sectors even in the presence of any defective memory cells that suffer from a leakage failure in said sectors.

16. A non-volatile semiconductor memory according to claim 15, wherein each of said plurality of constant current circuits is a current mirror circuit, and constant current transistors each of which produces an output current corresponding to an input current to said current mirror circuit are connected to said plurality of regions of sectors.

17. A non-volatile semiconductor memory according to claim 15, further comprising a switch for releasing the constant current operation by said plurality of transistors during non-erasure operation of the data.

18. A non-volatile semiconductor memory according to claim 15, wherein said non-volatile semiconductor memory is a split-gate type of EEPROM.

* * * * *